United States Patent
Longgood et al.

[19]

[11] Patent Number: 6,045,032
[45] Date of Patent: Apr. 4, 2000

[54] METHOD OF PREVENTING SOLDER REFLOW OF ELECTRICAL COMPONENTS DURING WAVE SOLDERING

[75] Inventors: Stuart E Longgood, Kokomo; Douglas E Gullion, Greentown; Darrel E Peugh, Kokomo; Wayne Anthony Sozansky, Greentown, all of Ind.

[73] Assignee: Delco Electronics Corp., Kokomo, Ind.

[21] Appl. No.: 09/127,275

[22] Filed: Jul. 31, 1998

[51] Int. Cl.[7] ....................................................... H05K 3/34
[52] U.S. Cl. ............................... 228/180.21; 228/180.22; 228/222; 228/46
[58] Field of Search ........................... 228/180.1, 180.21, 228/180.22, 214, 215, 222, 37, 39, 46

[56] References Cited

U.S. PATENT DOCUMENTS

| | | | |
|---|---|---|---|
| 3,430,686 | 3/1969 | Parkison et al. | 165/134.1 |
| 4,833,301 | 5/1989 | Furtek | 219/388 |
| 5,447,886 | 9/1995 | Rai | 228/180.22 |

*Primary Examiner*—Samuel M. Heinrich
*Attorney, Agent, or Firm*—Jimmy L. Funke

[57] ABSTRACT

A method of preventing solder reflow of a SMT component (14) attached with solder (22) to a circuit board (10) that subsequently undergoes a wave soldering operation. The method generally entails the use of a thermal shield (18, 28) that is either part of the support structure (12) for the circuit board (10) during the wave soldering operation, or a temporary mask (28) applied directly to a surface of the circuit board (10). In each case, the thermal shield (18, 28) is configured to contact and completely cover a limited surface region of the circuit board (10) directly opposite the SMT component (14). To provide adequate thermal protection, the covered surface region is preferably as large as or larger than the surface area of the component (14). In a preferred embodiment, the perimeter of the thermal shield (18, 28) has a tapered thickness, e.g., a beveled edge, that enables uninterrupted wave soldering of the surface surrounding the thermal shield (18, 28).

20 Claims, 1 Drawing Sheet

METHOD OF PREVENTING SOLDER REFLOW OF ELECTRICAL COMPONENTS DURING WAVE SOLDERING

FIELD OF THE INVENTION

The present invention generally relates to surface-mount circuit components and processes. More particularly, this invention relates to a technique for preventing solder reflow of a surface-mount component during a subsequent wave soldering operation performed on the circuit board to which the component is attached.

BACKGROUND OF THE INVENTION

Wave soldering is a well-known method by which solder connections are formed on a printed circuit board (PCB) by bringing the circuit board in contact with a "wave" of molten solder flowing upward from a nozzle. Wave soldering methods typically apply a relatively thin coating of solder, and therefore find widest use for applications in which a solderable contact or metal lead is to be coated with solder to form a solder fillet or solder connection, respectively. One such example is a circuit component having leads that extend through a circuit board, and to which solder is applied to physically and electrically connect the component to the board. During wave soldering, the circuit board, placed on a pallet, passes through molten solder coming up from the nozzle, such that the ends of the leads projecting through the circuit board are brought in contact with the upward-flowing molten solder. In the process of adhering to the leads, the solder forms solder connections or fillets.

While leaded packaged circuit devices are widely employed in electronic applications, and wave soldering is widely practiced to attach and electrically connect such devices to printed circuit boards, a continuous effort to reduce the size of circuit board assemblies has promoted the use of such advanced packaging technologies as tape automated bonding (TAB), chip on board (COB), flip chips, multichip modules (MCM) and ball grid arrays (BGA). These devices are generally surface-mount technology (SMT) components attached to a circuit board with solder, such as solder bumps that are formed on the devices and then reflowed to solder the devices to appropriate conductor patterns on the board. While highly successful, SMT devices are vulnerable to downstream processes that can raise the temperature of the solder above its melting or solidus temperature, causing the solder to reflow and create shorts and open circuits. Examples of downstream processing that have caused unwanted solder reflow include wave soldering in addition to glue cures, epoxy cures, conformal coating cycles, and solder reflow for other devices elsewhere on the board. Reduced board thicknesses have also increased the occurrence of unwanted solder reflow and may become sufficiently distorted during processing to break solder connections of a SMT component.

As a particular example, a circuit board with SMT components such as flip chips may also have leaded devices that require wave soldering. If 63Sn/37Pb eutectic solder (melting temperature of about 183° C.) is used to form the solder connections for the flip chips, subsequent processes including the wave soldering operation must not raise the flip chip solder connections to a temperature of 183° C. or above. However, wave soldering subsequently performed on the same circuit board with the same or higher-temperature solder used to form the flip chip connections will tend to cause unwanted solder reflow of those connections, during which the solder melts and expands. Because solder joints of a flip chip are typically encased in an organic underfill adhesive, a pressure is generated that can possibly result in adhesive failure of the underfill from the flip chip. Altering the wave soldering parameters, including preheat temperature and belt speed, has not eliminated the occurrence of unwanted solder reflow. There are additional measures that can be taken to reduce the incidence of unwanted solder reflow, such as the use of alternative devices, processes and materials to reduce the temperature to which the SMT components will be exposed, and using solders with higher melting/solidus temperatures to form the SMT solder connections. However, such solutions are often not practical.

Therefore, what is needed is a technique by which unwanted solder reflow of a SMT component can be avoided during a subsequent wave soldering operation. Preferably, such a technique would not complicate processing or compromise solder connections formed by the wave soldering process.

SUMMARY OF THE INVENTION

It is an object of this invention to provide a technique that provides thermal protection to a SMT component on a circuit board during wave soldering.

It is another object of this invention that such a technique involves a thermal shield that serves as a temporary thermal insulator and heat sink during wave soldering to the extent that the solder connections of the SMT component remain below their melting/solidus temperature.

In accordance with a preferred embodiment of this invention, these and other objects and advantages are accomplished as follows.

The present invention provides a method of preventing solder reflow of a SMT component attached with solder to a circuit board that subsequently undergoes a wave soldering operation. The method generally entails the use of a thermal shield that is either part of the support structure for the circuit board during the wave soldering operation, or a temporary mask applied directly to a surface of the circuit board. In each case, the thermal shield is configured to contact and completely cover a limited surface region of the circuit board directly opposite the SMT component. To provide adequate thermal protection, the covered surface region is preferably as large as or larger than the surface area of the component. In the latter case, the thermal shield superimposes the component, which as used herein means that the component would fit completely within the footprint of the thermal shield if the thermal shield could be seen through the circuit board. In a preferred embodiment, the perimeter of the thermal shield has a tapered thickness, e.g., a beveled edge, that enables uninterrupted wave soldering of the surface surrounding the thermal shield.

According to the invention, wave soldering the surface of a circuit board having SMT components protected with a thermal shield of the type described above does not heat the SMT solder connections above their melting temperature, even though the solder applied during wave soldering is at a temperature well above the melting temperature of the SMT solder connections. Whether in the form of an extension of the pallet or a solder mask applied to a limited surface region of the circuit board, the present invention can be practiced in a manner that does not alter or interfere with the wave soldering process, such that wave solder process parameters can be optimized to ensure proper soldering of leaded components to the circuit board.

Other objects and advantages of this invention will be better appreciated from the following detailed description.

BRIEF DESCRIPTION OF THE DRAWINGS

The present invention will now be described by way of example, with reference to the accompanying drawings in which.

DETAILED DESCRIPTION OF THE INVENTION

Figure 1:
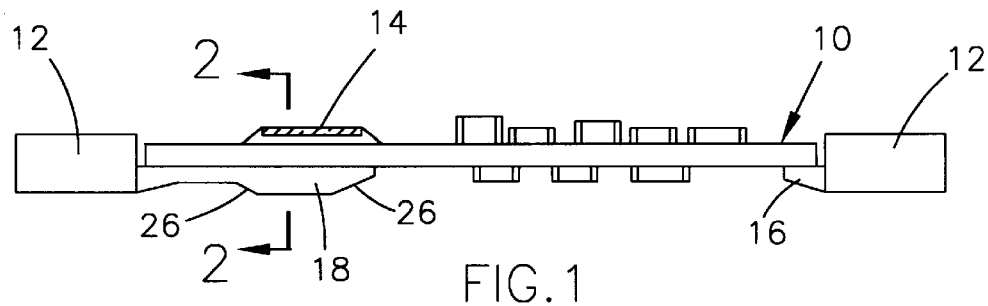
FIG. 1 is a side view of a circuit board prepared for wave soldering in accordance with a first embodiment of the present invention.

Illustrated in FIG. 1 is a circuit board 10 supported by a pallet 12 in preparation for undergoing wave soldering in accordance with this invention. For purposes of this invention, the circuit board 10 includes a number of surface-mount technology (SMT) components, one of which is a flip chip 14 shown in greater detail in FIG. 2. As is generally conventional, one edge of the circuit board 10 is supported by an edge support 16 on the pallet 12. In accordance with the prior art, the edge support 16 is intended to support the circuit board 10, and does not extend into the interior regions of the circuit board 10 so as not to interfere with the wave soldering operation. In contrast, a pallet extension 18 on the side of the pallet 12 opposite the support 16 projects inwardly to an extent necessary to completely cover a surface region of the lower surface of the board 10 and directly beneath the flip chip 14. As can be best seen in FIG. 2, the surface region covered by the extension 18 is as large as or larger than the surface area of the flip chip 14 and the underfill 20 used to encapsulate the solder connections 22 between the chip 14 and its conductors 24 on the circuit board 10. If the extension 18 could be viewed from above through the circuit board 10, the flip chip 14 would be completely superimposed by the extension 18.

The function of the extension 18 is to prevent rapid heat conduction to the flip chip 14 and its solder connections 22, so that the connections 22 do not reflow during wave soldering of the lower surface of the board 10 using molten solder at a temperature at or above the melting temperature of the solder connections 22. For convenience, "melting temperature" will be used to refer to the melting temperature of a eutectic solder alloy and the solidus temperature of a non-eutectic alloy. To perform its intended function, the extension 18 must be sufficiently thick to provide the required thermal insulation, yet must not be so thick as to interfere with wave soldering of neighboring leaded components. In practice, extensions having a thickness of about one millimeter have performed suitably, though thicker and thinner extensions are foreseeable.

Figure 2:
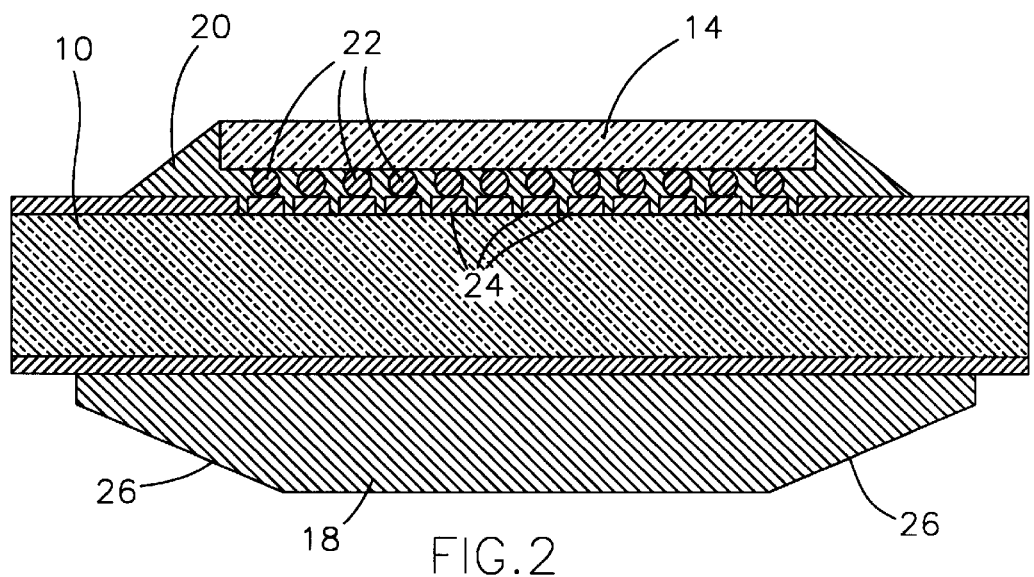
FIG. 2 is a detailed cross-sectional view along line 2—2 of the circuit board of FIG. 1.

According to the invention, the perimeter 26 of the extension 18 is preferably tapered or beveled as shown in FIGS. 1 and 2 for the purpose of promoting access of molten solder to the components intended to be wave soldered on the underside of the circuit board 10. The extension 18 is portrayed in FIG. 1 as being an insert or attachment to the pallet 12, though it could be formed as an integral part of the pallet 12, e.g., machined directly from the pallet material. Various materials could be used to form the extension 18, including metals and plastics, with particularly suitable materials being glass-filled organic materials of the type used to form the pallet 12.

Figure 3:
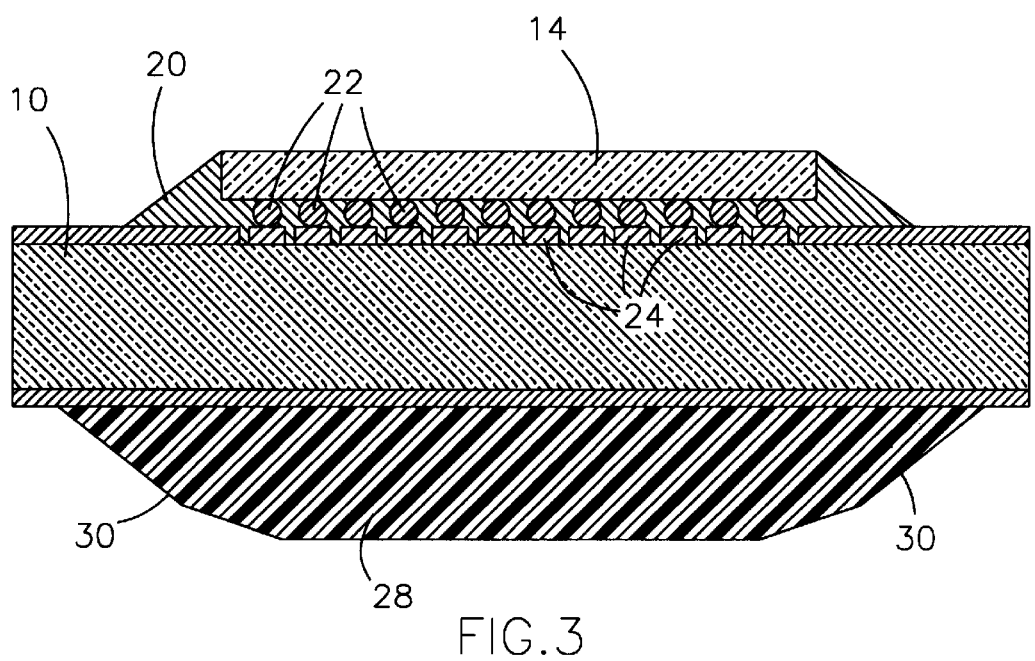
FIG. 3 is a detailed cross-sectional view of a circuit board protected by a solder mask in accordance with a second embodiment of this invention.

In an alternative embodiment of this invention shown in FIG. 3, the surface region directly beneath the flip chip 14 is completely covered by a mask 28, preferably a solder mask of a type known in the art. Examples of suitable mask materials include commercially-available latex moisture-cure and silicone UV-cure systems. As with the extension 18 of the first embodiment, the surface region covered by the mask 28 shown in FIG. 3 is as large as or larger than the surface area of the flip chip 14 and its underfill 20. Also similar to the extension 18, if the mask 28 could be viewed from above through the circuit board 10, the flip chip 14 would be completely superimposed by the mask 28. Again, the mask 28 prevents rapid heat conduction to the flip chip 14 and a rapid temperature rise at the solder connections 22, so that the connections 22 do not reflow during wave soldering using molten solder at a temperature at or above the melting temperature of the solder connections 22. In practice, a suitable thickness for the mask 28 is about 0.5 to 2.5 millimeters, with a preferred thickness being about 0.8 to 2.0 millimeters in order to provide the required thermal insulation. The mask 28 also preferably has a tapered perimeter 30 as shown so as not to interfere with wave soldering of neighboring components. The tapered edge of the mask 28 can be achieved as a result of the mask material naturally flowing outward after its deposition. The mask 28 is preferably selectively deposited on the surface region and cured prior to wave soldering and then removed, or peeled off, after wave soldering.

During an investigation leading to this invention, testing was conducted to determine the relationship between wave soldering parameters and possible solutions to the occurrence of unwanted solder reflow of SMT components. A first phase of testing involved subjecting fiberglass circuit boards with SMT components to wave soldering processes in which the circuit board preheat temperatures and conveyor (belt) speeds were varied with a U2000 wave solder machine commercially available from Electrovert of Grand Prairie, Texas. The molten solder was applied by the machine at a temperature of about 250° C. during the wave soldering operation. The results are summarized in Table I below, with the presence of defects ("% DEF.") being indicated for two different types of chips ("A" and "B") soldered to the circuit boards with 67Sn/37Pb eutectic solder (melting temperature of 183° C.). Temperatures are those measured in the underfill beneath the chips.

TABLE I

| BELT SPEED (m/min) | PREHEAT TEMP (° C.) | PEAK TEMP (° C.) | TEMP RISE (° C.) | MAX. RATE (° C./s) | TIME ABOVE 183° C. (s) | % DEF. "A" | % DEF. "B" |
|---|---|---|---|---|---|---|---|
| 1.5 | 83  | 206 | 123 | 16.4 | 14 | 33 | 50 |
| 1.5 | 101 | 227 | 126 | 14.2 | 27 | 20 | 66 |
| 1.5 | 89  | 204 | 115 | 14.2 | 14 | 16 | 60 |
| 1.5 | 110 | 225 | 115 | 13.0 | 27 | 50 | 33 |

The above results evidenced that, regardless of wave solder parameters used, a high level of defects (e.g., reflow resulting in solder collapse or bridging) resulted from the solder connections being heated to ("Peak Temp") and maintained at temperatures above their melting temperature ("Time Above 183° C.").

Thermal shields in accordance with this invention were then used to determine their ability to eliminate defects by reducing peak temperatures and/or time at peak temperature. Parameters and results are summarized in Tables II and III for circuit boards wave soldered using glass-filled organic pallets modified to include either one-millimeter stainless steel or glass-filled organic extensions, respectively, of the type shown in FIGS. 1 and 2. The glass-filled organic pallets and extensions were formed of a material available from EMC Global under the name ECP+. Three different chips ("A," "B" and "C," or "B" and "C" only) were soldered to fiberglass circuit boards with 67Sn/37Pb eutectic solder. Chips B and C were the same except for their locations on the boards. The extensions completely covered the surface regions directly opposite the chips, which is indicated as "COVERAGE 100%" in Tables II and III. "PRE." and "PEAK" are the preheat and peak temperatures, respectively, measured in the underfill beneath the chips.

Parameters and results are summarized in Table IV for seven circuit boards processed with a maskant formed by a fully or partially-cured moisture-cure latex material commercially available under the name "TC527" from Kester Solder of Des Plaines, Ill., and in Table V for four circuit boards processed with a UV-cured silicone maskant commercially available under the name "NUV-A-SIL" from the Loctite Corporation, all of the masks being configured in accordance with FIG. 3. Other than the use of only chips "B" and "C" and a maskant instead of a pallet extension, the circuit boards and solder were identical to those reported with Tables II and III. The thickness ("t") of each maskant is indicated in the tables, and coverage ("COV.") of the surface region directly opposite each chip is indicated as either 0%, 50% or 100% on the basis of surface area. As before, "PRE." and "PEAK" are the preheat and peak temperatures, respectively, measured in the underfill beneath the chips.

TABLE II

| BELT SPEED (m/min) | COVER-AGE (%) | SOLDER TEMP (° C.) | "A" PRE. (° C.) | "A" PEAK (° C.) | "B" PRE. (° C.) | "B" PEAK (° C.) | "C" PRE. (° C.) | "C" PEAK (° C.) |
|---|---|---|---|---|---|---|---|---|
| 1.5 | 100 | 249 | —  | —   | 85 | 172 | 96 | 170 |
| 1.5 | 100 | 241 | 84 | 168 | 83 | 174 | 92 | 161 |
| 1.5 | 100 | 225 | —  | —   | 87 | 172 | 95 | 158 |

TABLE III

| BELT SPEED (m/min) | COVER-AGE (%) | SOLDER TEMP (° C.) | "A" PRE. (° C.) | "A" PEAK (° C.) | "B" PRE. (° C.) | "B" PEAK (° C.) | "C" PRE. (° C.) | "C" PEAK (° C.) |
|---|---|---|---|---|---|---|---|---|
| 1.5 | 100 | 249 | — | — | 101 | 150 | 98  | 151 |
| 1.5 | 100 | 249 | — | — | 98  | 143 | 97  | 144 |
| 1.5 | 100 | 249 | — | — | 106 | 150 | 104 | 151 |
| 1.5 | 100 | 249 | — | — | 106 | 151 | 104 | 150 |

TABLE IV

| BELT SPEED (m/min) | SOLDER TEMP (° C.) | CURE | "B" | | | | "C" | | | |
|---|---|---|---|---|---|---|---|---|---|---|
| | | | t (mm) | COV. (%) | PRE. (° C.) | PEAK (° C.) | t (mm) | COV. (%) | PRE. (° C.) | PEAK (° C.) |
| 1.5 | 252 | none | 1.3 | 100 | 104 | 159 | 1.3 | 100 | 106 | 158 |
| 1.5 | 249 | part. | 0.8 | 100 | 106 | 178 | 0.8 | 100 | 114 | 175 |
| 1.5 | 249 | part. | 1.0 | 100 | 109 | 180 | 1.8 | 50 | 116 | 182 |
| 1.5 | 249 | part. | 0.8 | 100 | 110 | 165 | 1.3 | 100 | 116 | 177 |
| 1.5 | 249 | part. | 1.0 | 100 | 99 | 173 | 0.8 | 100 | 105 | 168 |
| 1.5 | 249 | full | 1.3 | 100 | 105 | 176 | 1.3 | 100 | 115 | 170 |
| 1.5 | 249 | full | 0.5 | 100 | 108 | 183 | — | 0 | 115 | 191 |

TABLE V

| BELT SPEED (m/min) | SOLDER TEMP (° C.) | CURE | "B" | | | | "C" | | | |
|---|---|---|---|---|---|---|---|---|---|---|
| | | | t (mm) | COV. (%) | PRE. (° C.) | PEAK (° C.) | t (mm) | COV. (%) | PRE. (° C.) | PEAK (° C.) |
| 1.5 | 249 | full | 1.0 | 100 | 106 | 176 | 1.0 | 100 | 113 | 171 |
| 1.2 | 250 | full | 1.0 | 100 | 77 | 172 | 1.0 | 100 | 82 | 167 |
| 1.4 | 250 | full | 1.0 | 100 | 76 | 169 | 1.0 | 100 | 81 | 161 |
| 1.4 | 250 | full | 1.0 | 100 | 81 | 171 | 1.0 | 100 | 87 | 166 |

From the above, one can see that the peak temperatures of the flip chips did not exceed the 183° C. melting temperature for their solder connections when adequate thermal protection was present, i.e., correct thickness, area coverage and fully-cured material, and consequently the connections did not suffer any defects due to collapsing or bridging of the solder. Two instances occurred where peak temperatures were at or above 183° C., both of which occurred on the same circuit board. A peak temperature of 191° C. for chip "C" occurred because a mask was not present on the board opposite the chip; a peak temperature of 183° C. for chip "B" was attributed to the mask having a thickness of only 0.5 millimeter. On a different board, chip "C" reached a peak temperature of 182° C. because the mask only covered 50% of the area under the chip. In view of these results, material thickness and coverage requirements should be tailored to individual applications in order to meet thermal insulation requirements, allowing for process variation such as conveyor speed, preheat temperature and solder temperature.

While our invention has been described in terms of a preferred embodiment, it is apparent that other forms could be adopted by one skilled in the art. Accordingly, the scope of our invention is to be limited only by the following claims.

What is claimed is:

1. A method of preventing solder reflow of a component attached to a circuit board with solder, the method comprising the steps of:

providing a circuit board having a component attached with solder to a first surface of the circuit board;

placing the circuit board on a pallet such that a second surface of the circuit board opposite the first surface contacts the pallet, a thermal shield contacting the second surface of the circuit board and completely covering a surface region thereof directly opposite the component so that the component is superimposed by the thermal shield; and placing the pallet on a wave soldering apparatus and wave soldering the second surface of the circuit board at a temperature above a melting temperature of the solder that attaches the component to the circuit board, the thermal shield preventing the solder on the first surface from reaching the melting temperature.

2. A method as recited in claim 1, wherein the surface region covered by the thermal shield has a surface area larger than a surface area of the component.

3. A method as recited in claim 1, wherein the thermal shield has a perimeter with a tapered thickness.

4. A method as recited in claim 1, wherein the thermal shield is an extension of the pallet.

5. A method as recited in claim 4, wherein the extension is formed from a material chosen from the group consisting of metals and glass-filled organic materials.

6. A method as recited in claim 4, wherein the pallet supports the circuit board at a perimeter thereof and the extension extends inwardly from the perimeter.

7. A method as recited in claim 4, wherein the extension has a beveled perimeter.

8. A method as recited in claim 4, wherein the surface region covered by the extension has a surface area larger than a surface area of the component.

9. A method as recited in claim 1, wherein the thermal shield is a solder mask applied to the surface region of the circuit board.

10. A method as recited in claim 9, wherein the surface region covered by the solder mask has a surface area larger than a surface area of the component.

11. A method as recited in claim 9, the method further comprising the steps of:

selectively depositing the solder mask on the surface region;

curing the solder mask prior to the wave soldering step; and removing the solder mask after the wave soldering step.

12. A method as recited in claim 9, wherein the solder mask has a perimeter with a tapered thickness.

13. A method of preventing solder reflow of a component attached to a circuit board with solder, the method comprising the steps of:

providing a circuit board having a component attached with solder to a first surface of the circuit board;

placing the circuit board on a pallet such that a second surface of the circuit board opposite the first surface contacts the pallet, the pallet having an extension that contacts the second surface of the circuit board and completely covers a surface region thereof directly opposite the component, the component being superimposed by the extension; and then placing the pallet on a wave soldering apparatus and wave soldering the second surface of the circuit board at a temperature above a melting temperature of the solder that attaches the component to the circuit board, the extension of the pallet preventing the solder on the first surface from reaching the melting temperature.

14. A method as recited in claim 13, wherein the surface region covered by the extension has a surface area larger than a surface area of the component.

15. A method as recited in claim 13, wherein the extension is formed from a material chosen from the group consisting of metals and glass-filled organic materials.

16. A method as recited in claim 13, wherein the extension has a beveled perimeter.

17. A method of preventing solder reflow of a component attached to a circuit board with solder, the method comprising the steps of:

providing a circuit board having a component attached with solder to a first surface of the circuit board and a second surface opposite the first surface;

selectively depositing a solder mask on a surface region of the second surface directly opposite the component, the solder mask completely covering the surface region so that the component is superimposed by the solder mask;

curing the solder mask prior to the wave soldering step;

placing the circuit board on a pallet such that the second surface of the circuit board contacts the pallet; and then placing the pallet on a wave soldering apparatus and wave soldering the second surface of the circuit board at a temperature above a melting temperature of the solder that attaches the component to the circuit board, the solder mask of the pallet preventing the solder on the first surface from reaching the melting temperature.

18. A method as recited in claim 17, further comprising the step of removing the solder mask after the wave soldering step.

19. A method as recited in claim 17, wherein the solder mask has a thickness of about 0.5 to 2.5 millimeters.

20. A method as recited in claim 17, wherein the solder mask has a perimeter with a tapered thickness.

* * * * *